United States Patent [19]

Domeshek

[11] 4,065,309

[45] Dec. 27, 1977

[54] METHOD OF ENHANCING THE INFORMATION LEGIBILITY OF MULTI-COLOR GRAPHIC MATERIAL

[76] Inventor: Sol Domeshek, 24 Springfield Ave., Cranford, N.J. 07016

[21] Appl. No.: 713,019

[22] Filed: Aug. 9, 1976

Related U.S. Application Data

[63] Continuation of Ser. No. 514,698, Oct. 15, 1974, abandoned.

[51] Int. Cl.² .......................... G03C 7/16; G03C 7/00
[52] U.S. Cl. ........................................... 96/14; 96/24; 101/DIG. 1
[58] Field of Search ....................... 96/14, 24; 101/211

[56] References Cited

U.S. PATENT DOCUMENTS

| | | | |
|---|---|---|---|
| 2,326,321 | 8/1943 | Barmeier | 101/211 |
| 3,044,202 | 7/1962 | Lindmark | 101/211 X |
| 3,798,033 | 3/1974 | Yost | 96/24 |

OTHER PUBLICATIONS

Flader et al.; Modern Photoengraving © 1948 pp. 119–126, Modern Photoengraving Publ., Chicago.
The Lithographers Manual, Shapiro, 4th Ed. (6–10-15) Graphic Arts Technical Foundation, Pittsburgh, Pa.

*Primary Examiner*—David Klein
*Assistant Examiner*—Louis Falasco
*Attorney, Agent, or Firm*—Nathan Edelberg; Sheldon Kanars; Roy E. Gordon

[57] ABSTRACT

The information legibility of multi-color graphic material is enhanced by a method illustrated as follows: Frames of panchromatic silver-halide black and white negative film are separately exposed through red, green, and blue transmitting filters respectively to an image of the original multicolor material. The negative images on the frames of film are developed and fixed, and then printed on respective red, green, and blue-dye developing positive transparency materials. The red-dye, green-dye and blue-dye positive transparencies are then superimposed and retained in register.

9 Claims, 1 Drawing Figure

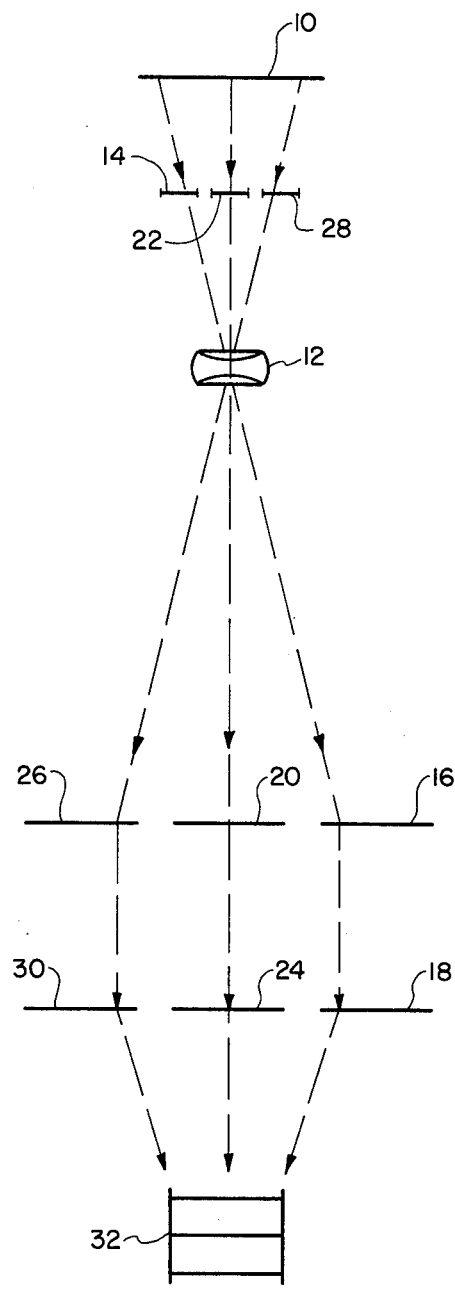

METHOD OF ENHANCING THE INFORMATION LEGIBILITY OF MULTI-COLOR GRAPHIC MATERIAL

This is a continuation of application Ser. No. 514,698 filed Oct. 15, 1974, now abandoned.

This invention relates in general to a method of enhancing the information legibility of multi-color graphic material, and in particular to a method of making a dark-field, positive full-color graphic from any of a wide variety of full-color graphics normally printed or otherwise available on white opaque or clear transparent backgrounds.

BACKGROUND OF THE INVENTION

Heretofore, dark-field, positive full-color graphics have been made by re-drawing the chosen color-graphics manually in their original colors but with a low-noise or dark background and with white symbols and alphanumerics wherever these appeared in black on the original graphic. Once such re-drafting has been done manually, conventional photographic procedures could be employed in conventional sequence to prepare plates to reprint the dark-field graphic or to prepare full-color transparencies or photo-prints of the dark field product. The difficulty with the above described method is that it is extremely time-consuming and extremely costly. If the color transfer into the low noise or dark background form is not carried out, the efficiency and effectiveness of the resulting color displays are largely reduced for many applications.

SUMMARY OF THE INVENTION

The general object of this invention is to provide a method of enhancing the information legibility of multi-color graphic material in which the various categories of information are conveyed by natural or symbolic color codes against a white or clear background. A further object of the invention is to provide such a method without disturbing the information content of the color-codes. A still further object of the invention is to provide such a method in which the noninformation areas of the graphic material are transformed from a white or zero density and therefore, high noise intensity background to a black or high density and therefore, low noise intensity background. Another object of the invention is to provide such a method in which the signal-to-noise ratio of all color-coded information with respect to background is enhanced, thus enhancing the graphic's contrast as well as its legibility.

According to the invention, all the foregoing objectives are attained by a method involving separately exposing frames of panchromatically photo-sensitive, black-and-white, negatively recording, transparent material (or transparencies) through red, green, and blue transmitting filters respectively to an image of the original multi-color material. After developing and fixing these color-separated, black and white, negative images on the transparencies, these respectively red-, green-, and blue-filtered images are printed respectively on positive-imaging red-, green-, and blue-dye developing transparent materials. The red-dye, green-dye, and blue-dye positive image transparencies are then superimposed in any order and retained in register to obtain the dark-field, positive, full-color graphic.

DESCRIPTION OF THE DRAWING AND THE FIRST EMBODIMENT

The invention can best be understood by referring to the drawing which is a diagrammatic flow chart of a method according to the invention.

Referring to the drawing, the arrows therein represent the sequence of the method. The original graphic multi-color material, 10, such as a standard road map printed on white paper, is mounted on a copy board (not shown). A copy camera 12 with the first of a set of color-separation filters, in this instance, a red-transmitting filter 14, mounted over the lens is used to obtain an image of the original multi-color material 10. The red-transmitting filter 14 may be characterized by a peak wavelength of 650 millimicrons, with a transmittance at that wavelength of 88 percent, and a bandwidth of 590 to 690 millimicrons. The copy camera 12 is also loaded with a panchromatic, negative-imaging material 16 such as panchromatic, silver-halide, black-and-white, photographic film. The negative film 16 is then exposed through red filter 14 mounted over the lens of the copy camera 12 to an image of the original multi-color material 10. The negative image on the film 16 is developed, fixed, and then printed on a photographic, positive-imaging, like-color or red-dye-developing transparent material 18.

A red mark on the original multi-color graphic material 10 imaged through the red-transmitting filter 14 on the panchromatic, black-and-white, negatively recording material 16 appears on that material or colorless areas of low optical density as a relatively high-density mark. White areas on the original multi-color graphic also appear as areas of high optical density on the negative material 16, and green and blue marks on the original 10 appear on the negative material 16 respectively with progressively lesser densities. Any black or colorless high optical density markings on original multi-color graphic 10 appear as zero optical density areas on negative material 16. When the red-filtered negative image on film 16 is printed on the red-developing, positive-imaging film 18, the maximum density negative marks that are red and white on the original multi-color graphic 10 translate as a maximum density red marks, and the progressively lesser density negative marks that are green and blue on the original 10 show as progressively lesser density red marks. The zero density negative marks that are black on the original 10 show as clear or low optical density, colorless marks on the positive-imaging film 18.

The copy camera 12 is then loaded with a fresh frame of the panchromatic black-and-white negative-imaging material 20 and the frame exposed through the second of a set of color-separation filters, in this instance, a green filter, 22 to an image of the original graphic multi-color material 10 formed by the camera lens. The green transmitting filter 22 may be characterized by a peak wavelength of 530 millimicrons with a transmittance at that wavelength of 54 percent, and a bandwidth of 470 to 610 millimicrons. After development, the green-filtered black-and-white negative image 20 is printed on like-color or green dye positive-imaging transparent material 24.

By analogy to the effects of the procedures traced through in the case of the red-filtered imagery, the green-filtered process yields relatively high-density green marks on the green-dyed positive image 24 for each green and white mark on the original multi-color graphic 10, and lesser density marks on the green-dyed positive 24 for the blue and red marks on the original 10. Similarly, clear, colorless areas appear on positive 24 for all black markings on original 10.

The copy camera 12 is again reloaded with fresh panchromatic negative-imaging black-and-white material 26, and an exposure of the original multi-color graphic 10 is made through the third of a set of color-separation filters: in this instance blue filter 28. The blue transmitting filter 28 may be characterized by a peak wavelength of 430 millimicrons with a transmittance at that wavelength of 50 percent, and a bandwidth of 400 to 510 millimicrons. The fixed blue-filtered, negative black-and-white image 26 is then printed on like-color or blue dye positive-imaging transparent material 30.

By analogy to the previous case, the results of the blue-dye positive-image 30 exhibit the following characteristics:

High-density blue marks correspond to blue and white marks on the original 10, progressively lesser density blue marks correspond to green and red marks on the original 10; and clear, colorless marks correspond to black areas on original 10.

The red-dye positive image transparency 18, the green-dye positive image transparency 24, and the blue-dye positive image transparency 30 are then superimposed, in register and in any order, and bound to form a sandwich 32. The sandwich then duplicates all colors as they appear in the original multi-color graphic 10. However, in each dyed positive-image transparency of the sandwich, white areas of the original 10 appear as high-density red, green, or blue areas respectively. Thus, the sandwiched areas on 32 that were originally white on 10 appear as relatively high density or dark areas due to the absorption of significant portions of the red, green, and blue light in the overlaid transparency layers. Conversely, since black on original 10 appears in each dyed, positive transparency as clear and colorless, in the final sandwich 32, all markings originally black in 10 appear as clear and colorless in the sandwiched transparency.

Thus, all color information stays in its original positive color form, but the white field has been transformed to a high-density or dark field, and all black lines, numerals, and text in the original appear as colorless low-density or light imagery.

EXAMPLE II

The same basic method is used as in the first embodiment except that a single frame of commercially available integral tri-pack color material, such as Ektachrome or Ansco-Chrome, is used in place of the previously described sandwich 32 of complementary-color-separated red-, green-, and blue-dye positive-imaging materials.

As is well known in the art, the general term "Integral Tri-Pack" is commonly employed in photographic literature to designate a color photographic material in which 3 emulsions, each separately sensitized to one of 3 primary colors, are coated over one another on the same base. The 3 emulsions are not separable and must be handled together during processing. This kind of material structure is applied in modern color photography to reversal, negative-positive, and paper print processes.

In the embodiment of this example, cyan-, magenta-, and yellow transmitting filters are used respectively as the set of first, second, and third color-separation filters.

The cyan transmitting filter may be characterized by peak wavelengths of 480 millimicrons and 700 millimicrons with respective transmittances at those wavelengths of 53 percent and 0.7 percent and respective bandwidths of 400 to 580 millimicrons and 690 to 700 millimicrons. Similarly, the magenta transmitting filter may be characterized by peak wavelengths of 455 millimicrons and 670 millimicrons with respective transmittances at those wavelengths of 66 percent and 91 percent and respective bandwidths of 400 to 520 millimicrons and 600 to 700 millimicrons; and the yellow transmitting filter may be characterized by peak wavelengths of 315 millimicrons and 580 millimicrons with respective transmittances at those wavelengths of 1.5 percent and 90 percent and respective bandwidths of 300 340 millimicrons and 500 to 700 millimicrons. The resulting black-and-white negative images are then transferred through red-, green-, and blue-light respectively onto a single frame of integral color tri-pack which, when processed, also shows all color information in original color form while all white areas on the original 10 are dark and all black areas on the original 10 are clear and colorless.

The cyan, magenta, and yellow filters, in this embodiment leave original red, green, and blue markings clear on the respective panchromatic negative, black-and-white recordings while white markings are dark and black markings are clear on these recordings. These negatives now respectively exposed through red, green, and blue light onto the positive-printing, integral color tri-pack will transfer to the color recording the original color information in the same sense while white and black are respectively reversed from the original to the copy.

EXAMPLE III

In this embodiment, the basic method remains the same, but the sequence of color-separated (e.g. red-, green-, and blue-filtered) negative images of the original multi-color graphic 10 is presented again through a panchromatic sensor on a phosphorescent screen whose intensity and spectral output have been selected to satisfy the exposure requirements of the family of positive-imaging, like-color e.g. red-, green-, and blue-dye developing transparent materials respectively that may be employed.

An example of means for the creation and presentation of the sequence of red-, green-, and blue-filtered phosphorescent instead of silver-halide negative images of the original multi-color graphic 10 is illustrated by the contrast reversal of a panchromatic black-and-white televised scene to generate a negative image. Such negative output phosphorescent image has the requisite characteristics to satisfy the requirements, for instance, of the red channel of the dark-field, full-color transparency when a panchromatic Black-and-White TV camera scans the original multi-color graphic through a red filter while the phosphor in the output cathode ray tube yields sufficient ultra-violet light to expose the red diazochrome foil to the cathode ray tube's negative image.

Thus, in one hard-copy photographic step instead of two as in the first embodiment or in Example II, the red-channel, diazochrome film image for the dark-field, full-color transparency is obtained in hard-copy form. By analogous procedure the green- and blue-channel diazochrome film images are each obtained in a single hard-copy photographic step, and, as in the first embodiment, by superposing in register these three positive-image, color diazochrome films, the same final product is obtained, namely: a dark-field transparency with all color information the same as in the original graphic while original white areas are now dark and original black areas are now clear.

EXAMPLE IV

By combining the process variations introduced in Examples II and III, a further procedural economy is obtained. However, this combination itself is subject to differentiation as a function of the specific equipment employed. Thus: a. Cyan-, magenta-, and yellow-filtered negative images of the original graphic are presented in turn as in Example III on a white-light-output phosphorescent screen which is used, through a corresponding succession of red, green, and blue filters, to expose a single frame of integral tri-pack, positive printing, color photographic material.

b. The sequence of color-separated images of the original multi-color graphic 10 as in (a) above is presented for each color channel in turn as a corresponding-color, phosphorescent negative image via contrast reversal of each color channel of a full-color TV system. Without any further filtering between the phosphorescent images and the integral tri-pack color photographic material, the tri-pack photo material is exposed in turn to each red, green and blue phosphorescent color negative image as it is generated.

On development of the tri-pack material via exposure through either of the above procedures (a) or (b), a dark-field transparency is obtained with all color information the same as in the original graphic while whites and blacks on the original are reversed in the copy.

EXAMPLE V

An additional variation of the invention's method for achieving dark-field, full-color graphics employs a combination of photographic and photo-engraving or photo-lithographic printing techniques. Note that typically in these printing techniques, to making the printing plate, an image is formed by light-hardening of a photo-sensitive substance coated on the plate. The exposing light makes this coating less soluble than unexposed areas which are dissolved during development of the image on the plate. On completing plate treatment by usual photo-engraving or photo-lithographic techniques, ink will print from the plate only where a protective image had been formed by the light-hardened coating. Conventional printing techniques, therefore, require sensitized photo-engraving or photo-lithographic plates to be exposed to negative images of the original graphic material that is to be printed in positive form - whether black and white or color. Moreover, for conventional full color reproduction, the color printing inks must also be the negative of the color separation filters.

For this variation, the invention's basic white-to-black field reversal principle, which retains all original colors in their positive sense in the copy, is illustrated by the following procedure:

Three printing plates coated with panchromatic-sensing, negative imaging, black-and-white photographic emulsion are exposed respectively through halftone screens to color-separated [e.g. red-, yellow-, and blue- (or magenta-, yellow-, and cyan-)] filtered images of the original multi-colored graphic on white or clear background. On development, these printing plate emulsions leave images that protect the plates beneath during the remaining litho-or engraving-plate preparation so that each plate renders, in the same color ink, the patterns of the filter-colored light that struck it and does not print where light did not strike.

Thus, if the red, yellow, blue color-separation set is used, original red and white as red; original yellow and white prints as yellow: and original blue and white as blue: while original black is not printed by any plate. The overprint of these plates on a white background then yields red, yellow, and blue images corresponding to the patterns of these images on the original; the original white areas (with red, yellow and blue overprints) reproduce as dark background: and the original black-printed information, with no pigment or other coloring substance on the copy, appears white.

A first modification to this variation of the invention occurs where the three printing plates are coated with a negative-imaging photo emulsion which is only monochromatically sensitive, blue only for example. In this instance, the red-, yellow-, and blue- (or magenta-, yellow-, and cyan-) filtered images of the original multi-colored graphic on white background are first recorded on panchromatic, black-and-white, negative-imaging photographic material; these respective color-separated negative records are each transformed to positive, color-separated, black-and-white images on another or intermediate set of negative-imaging black-and-white photo materials; and to this last photographic, color-separation set, the emulsions on the set of printing plates are exposed, developed, and the plates processed as before in the litho - or engraving process.

As before, the overprint of these plates using inks corresponding to the filter color that led to each color-separated plate yields a reversed-field copy with original colors in their positive sense. It is to be noted that one photographic step may be saved if the color-separation from the original is accomplished onto panchromatic, positive-imaging, black-and-white, photographic material.

A second modification to this photographic/printing form of the invention substitutes a positive-imaging, panchromatic-sensing, black-and-white, television system as the means to expose the printing plate emulsions respectively as the TV camera scans the original multi-color graphic through red, yellow, and blue (or magenta, yellow and cyan) color-separation filters. In all other respects, the procedure is the same as in the initial case of Example V.

The resulting opaque, dark-field, full-color graphic may be photographed by conventional techniques onto an integral, tri-pack color material such as Ektachrome or Anschochrome to obtain a dark-field, full-color transparency. Moreover, this combined photographic/printing method is suited to applications requiring preparation of multiple copies of the dark-field, full-color graphics — while the first embodiment and Examples II, III, and IV are more suited to preparation of single copies or reproduction of relatively small quantities of copies of the dark-field, full-color graphics.

As noted heretofore, the only way of accomplishing the same effect as achieved by this present invention is, at great cost of time and money, to re-draw manually the chosen color-graphics with low-noise background and white symbols and text — and then, as appropriate to the specific application, to reproduce that new graphic by such conventional means as is appropriate.

The old methods without such change as noted above do not achieve any of the effects achieved by the present invention because inherently, and through all conventional reproduction techniques as well, the high-noise background against which the color information must be perceived is fully retained.

The present invention, therefore, cannot be described as a change, addition, or improvement over "an old method" but rather constitutes a radical departure from the old method — without which radical departure none of the invention's effects could be achieved practically.

The dark-field full-color graphic prepared by the invention has use as a map slide in an aircraft navigation display device. In this device, the video from a rotor-blade radar system may be directly combined at a cathode ray tube's phosphor surface with an optically rear-projected and appropriately scaled image of the map of the area over which the aircraft is flying. This enables the aircraft crew not only instantly to correlate radar features with the map but also enhances direct radar target identification, continuous aircraft positioning, and accurate long term navigation independent of wind effects.

I wish it to be understood that I do not desire to be limited to the exact details of construction shown and described, for obvious modifications will occur to a person skilled in the art.

What is claimed is:

1. Method of enhancing the information legibility of original multicolor graphic material, while retaining the colors of the original but reversing the colorless low optical density of the background of the original and high optical density of the black printed information of the original, said method including the steps of
   A. analyzing the original multicolor graphic into its component colors by filtering the original multicolor graphic material through a set of at least 3 color separation filters covering the total visual spectrum to produce a set of positive filtered images of said original multicolor graphic material and simultaneously exposing each of a set of printing plates coated with light-hardening, panchromatically photosensitive, monochromatically recording material through halftone screens to each of said positive filtered images;
   B. treating the set of printing plates by conventional photo-litho/photo-engraving development techniques so that each plate may print only the patterns of the filter-colored light that struck it;
   C. coating each of the set of printing plates with an ink having a color like the color of the filtered image to which each photocoated printing plate was originally exposed; and
   D. overprinting respectively in register from each of the set of photographically developed, color filtered and ink coated printing plates onto an optically low density, colorless print receiving surface.

2. Method of enhancing the information legibility of original multicolor graphic material, while retaining the colors of the original but reversing the colorless low optical density of the background of the original and high optical density of the black printed information of the original, said method including the steps of
   A. analyzing the original multicolor graphic into its component colors by filtering the original multicolor graphic material through a set of at least 3 color separation filters covering the total visual spectrum to produce a set of positive, filtered images of said original multicolor graphic material and simultaneously, singly exposing a set of frames of panchromatically photosensitive, black and white, negative recording material through halftone screens to each of said positive, filtered images;
   B. preparing a fixed, positive, black and white record from each of the color separated frames of (A);
   C. singly exposing each of a set of printing plates coated with light hardening, monochromatically photosensitive recording material to one of the set of positive records of (B) and treating the set of exposed printing plates by conventional photo-litho/photo-engraving development techniques so that each plate of the set may print only the patterns of the filter colored light that struck the frame in (A);
   D. coating each of the set of printing plates with an ink having a color like the color of the filtered image to which each antecedent frame in (A) of each photo-coated, printing plate of (C) was originally exposed; and
   E. overprinting respectively in register from each of the set of photographically-developed, color-filtered and ink coated printing plates of (D) onto an optically low density colorless print receiving surface.

3. Method of enhancing the information legibility of original multicolor graphic material, while retaining the colors of the original but reversing the colorless low optical density of the background of the original and the density of the black printed information of the original, said method including the steps of
   A. sequentially analyzing the original multicolor graphic into its component colors by filtering the original multicolor graphic material through a set of at least 3 color separation filters covering the total visual spectrum to produce a set of positive, filtered images of said original multicolor graphic material and simultaneously exposing a panchromatically photo-sensitive, positively imaging and monochromatically luminescent display system through half-tone screens to each of said positive, filtered images;
   B. singly exposing each of a set of printing plates coated with light hardening, monochromatically photosensitive recording material to each color-filtered luminescent display as it is generated;
   C. treating the set of printing plates by conventional photo-litho/photo-engraving development techniques so that each plate of the set may print only the patterns of the filter-colored light that struck the luminescent display in (A);
   D. coating each of the set of printing plates with an ink having a color like the color of the filtered image to which each antecedent luminescent display in (A) of each photo-coated printing plate of (C) was originally exposed; and
   E. overprinting respectively in register from each of the set of photographically developed, color filtered and ink coated printing plates of (D) onto an optically low density print receiving surface.

4. Method according to claim 1 wherein the set of color separation filters is additive.

5. Method according to claim 1 wherein the set of color separation filters is subtractive.

6. Method according to claim 2 wherein the set of color separation filters is additive.

7. Method according to claim 2 wherein the set of color separation filters is subtractive.

8. Method according to claim 3 wherein the set of color separation filters is additive.

9. Method according to claim 3 wherein the set of color separation filters is subtractive.

* * * * *